(12) United States Patent
Wang et al.

(10) Patent No.: US 10,115,696 B2
(45) Date of Patent: Oct. 30, 2018

(54) ELECTRONIC DEVICE AND METHOD FOR MANUFACTURING THE SAME

(71) Applicant: InnoLux Corporation, Miao-Li County (TW)

(72) Inventors: Yan-Syun Wang, Miao-Li County (TW); Chi-Che Tsai, Miao-Li County (TW); Chien-Feng Li, Miao-Li County (TW); Wei yun Chang, Miao-Li County (TW); Wei-Hsien Chang, Miao-Li County (TW); Po-Ching Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/239,885

(22) Filed: Aug. 18, 2016

(65) Prior Publication Data

US 2017/0053824 A1 Feb. 23, 2017

(30) Foreign Application Priority Data

Aug. 21, 2015 (CN) .......................... 2015 1 0518156

(51) Int. Cl.
   *H01L 23/00* (2006.01)
   *H01L 21/762* (2006.01)
   *H01L 21/02* (2006.01)

(52) U.S. Cl.
   CPC ........ *H01L 24/29* (2013.01); *H01L 21/02118* (2013.01); *H01L 21/02164* (2013.01); *H01L 21/02211* (2013.01); *H01L 21/02422* (2013.01); *H01L 21/02488* (2013.01); *H01L 21/7624* (2013.01); *H01L 24/32* (2013.01); *H01L 24/83* (2013.01); *H01L 2224/29099* (2013.01); *H01L 2224/29193* (2013.01)

(58) Field of Classification Search
   CPC ....... H01L 24/26; C09D 183/06; C08L 83/06; C09J 143/04
   See application file for complete search history.

(56) References Cited

U.S. PATENT DOCUMENTS

| 2015/0236274 A1* | 8/2015 | Hatakeyama | ....... H01L 51/0072 257/40 |
|---|---|---|---|
| 2016/0204175 A1* | 7/2016 | Kim | ..................... H01L 27/3258 257/40 |

FOREIGN PATENT DOCUMENTS

KR    20140076292 A  *  6/2014

OTHER PUBLICATIONS

Cammarano et al., Surface Modification of Polyester Film by Silane Treatment for Inorganic Layer Ahesion Improvement, 15th European Conference on Composite Materials, Jun. 24-28, 2012.*
Bahadir et al., Labe-free ITO-based Immunosensor for the Detection of a Cancer Biomarker, Royal Society of Chemistry, Analyst, 2016, 141, pp. 5618-5626.*

* cited by examiner

*Primary Examiner* — Selim Ahmed
*Assistant Examiner* — Evan Clinton
(74) *Attorney, Agent, or Firm* — Bacon & Thomas, PLLC

(57) ABSTRACT

An electronic device is disclosed, which comprises: a first substrate; an adhesion layer disposed on the first substrate and comprising a condensation product of silane or derivatives thereof; an inorganic layer disposed on the adhesion layer; and an active unit disposed on the inorganic layer. In addition, the present disclosure also provides a method for manufacturing the aforementioned electronic device.

13 Claims, 10 Drawing Sheets

ELECTRONIC DEVICE AND METHOD FOR MANUFACTURING THE SAME

CROSS REFERENCE TO RELATED APPLICATION

This application claims the benefits of the Chinese Patent Application Serial Number 201510518156.3, filed on Aug. 21, 2015, the subject matter of which is incorporated herein by reference.

BACKGROUND

1. Field of the Invention

The present disclosure relates to an electronic device and a method for manufacturing the same and, more particularly to an electronic device and a method for manufacturing the same in which the adhesion between the polymer substrate and the inorganic layer is improved by using an adhesion layer.

2. Description of Related Art

With the rapid development of electronic industry, electronic products are trending towards miniaturization and lightweight. Hence, the glass substrates used for preparing the electronic products are substituted with polymer substrates, to achieve the purposes of having lightweight, flexibility and impact resistance as well as being not easy to break or deform.

When the glass substrate is substituted with a polymer substrate, the polymer substrate is an organic material and a heterogeneous interface may be formed between the polymer substrate and the inorganic layer formed thereon. In this case, no covalent bond is formed at the heterogeneous interface between the polymer substrate and the inorganic layer, and the inorganic layer is mounted on the polymer substrate via the weak Van der waals force and anchoring force. During the process for forming the active unit, the inorganic layer may be separated from the polymer substrate or pinholes may be formed between the polymer substrate and the inorganic layer due to the high temperature and generated moisture. Therefore, the water vapor transmission rate and oxygen transmission rate of the electronic devices may be increased, resulting in the performance thereof deteriorated and the yield rate thereof further reduced.

Therefore, it is desirable to provide an electronic device in which the weak adhesion between the interfaces of the polymer substrate and the inorganic layer can be enhanced. Therefore, the problem that the inorganic layer is separated from the polymer substrate or the pinholes are generated therebetween can be solved; so the performance and yield rate of the obtained electronic device can further be improved.

SUMMARY

The present disclosure provides an electronic device and a method for manufacturing the same, wherein an adhesion layer formed by silane or derivatives thereof can increase the adhesion between a polymer substrate and an inorganic layer. Therefore, the problem that the inorganic layer is separated from the polymer substrate can be prevented.

The method for manufacturing an electronic device of the present disclosure comprises the following steps: providing a first substrate and modifying a surface of the first substrate to obtain a modified surface; applying silane or derivatives thereof on the modified surface to form an adhesion precursor layer; heat-treating the adhesion precursor layer to form an adhesion layer; forming an inorganic layer on the adhesion layer; and forming an active unit on the inorganic layer, wherein the inorganic layer is disposed between the adhesion layer and the active unit.

After the aforementioned process, the present disclosure provides an electronic device, which comprises: a first substrate; an adhesion layer disposed on the first substrate and comprising a condensation product of silane or derivatives thereof; an inorganic layer disposed on the adhesion layer; and an active unit disposed on the inorganic layer.

The method for manufacturing the electronic device of the present disclosure may further selectively comprise a step: providing a carrier and placing the first substrate on the carrier, before providing the first substrate. When a carrier is used, the method of the present disclosure may further selectively comprise a step: removing the carrier, after forming the active unit on the inorganic layer.

In the electronic device and the method of the present disclosure, a covalent bond is formed between the first substrate and the adhesion layer or the adhesion precursor layer, wherein the covalent bond preferably is —C—O—Si—. In addition, another covalent bond is also formed between the adhesion layer and the inorganic layer, and this covalent bond preferably is -M1-M2-C—, in which M1 is Si or Al, and M2 is O or N.

In the electronic device and the method of the present disclosure, the adhesion layer has a thickness ranging from 10 nm to 100 nm, and preferably ranging from 30 nm to 40 nm.

In the electronic device and the method of the present disclosure, the silane or the derivatives thereof may be represented by the following formula (I):

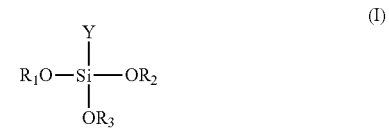

wherein each of $R_1$, $R_2$ and $R_3$ independently is H or $C_{1-6}$ alkyl; and Y is $C_{1-20}$ alkyl, $C_{2-20}$ alkenyl, $C_{1-20}$ alkyl-epoxy, epoxy, $C_{1-20}$ alkyl-acryl, or —O—$C_{1-20}$ alkyl. Preferably, each of $R_1$, $R_2$ and $R_3$ independently is H or $C_{1-3}$ alkyl; and Y is $C_{1-6}$ alkyl, $C_{2-6}$ alkenyl, $C_{1-6}$ alkyl-epoxy, epoxy, $C_{1-6}$ alkyl-acryl, or —O—$C_{1-6}$ alkyl.

In the present disclosure, preferably, $R_1$, $R_2$ and $R_3$ are the same. In one aspect of the present disclosure, $R_1$, $R_2$ and $R_3$ are the same and can be H or $C_{1-3}$ alkyl.

In the present disclosure, preferably, Y is $C_{1-20}$ alkyl-epoxy or epoxy. More preferably, Y is epoxy.

In the present disclosure, alkyl and alkenyl may selectively be substituted or unsubstituted. Possible substituents on alkyl and alkenyl include, but are not limited to, alkyl, halogen, alkoxy, alkenyl, heterocyclic group or aryl; but alkyl cannot be substituted with alkyl. Herein, the term "halogen" includes F, Cl, Br and I. The term "alkyl" refers to linear and branched alkyl; preferably, includes linear and branched $C_{1-20}$ alkyl; more preferably, includes linear and branched $C_{1-12}$ alkyl; and most preferably, includes linear and branched $C_{1-6}$ alkyl. Specific examples of alkyl include, but are not limited to, methyl, ethyl, n-propyl, iso-propyl, n-butyl, sec-butyl, iso-butyl, tert-butyl, pentyl, neo-pentyl or hexyl. The term "alkoxy" refers to a moiety that the alkyl defined in the present disclosure coupled with an oxygen atom; preferably, includes linear and branched $C_{1-20}$ alkoxy;

more preferably, includes linear and branched $C_{1-12}$ alkoxy; and most preferably, includes linear and branched $C_{1-6}$ alkoxy. Specific examples of alkoxy include, but are not limited to, methoxy, ethoxy, n-propoxy, iso-propoxy, n-butoxy, iso-butoxy, sec-butoxy, tert-butoxy, pentyloxy, neopentyloxy or hexyloxy. The term "alkenyl" refers to a linear or branched hydrocarbon moiety that contains at least one double bond; preferably, includes a linear and branched hydrocarbon $C_{2-20}$ moiety containing at least one double bond; more preferably, includes a linear and branched hydrocarbon $C_{2-12}$ moiety containing at least one double bond; and most preferably, includes a linear and branched hydrocarbon $C_{2-6}$ moiety containing at least one double bond. Specific examples of alkenyl include, but are not limited to, ethenyl, propenyl, allyl, or 1,4-butadienyl. The term "aryl" refers to a monovalent 6-carbon monocyclic, 10-carbon bicyclic, or 14-carbon tricyclic aromatic ring system. Specific examples of aryl include, but are not limited to, phenyl, naphthyl, pyrenyl, anthracenyl or phenanthryl; and preferably, the aryl is phenyl. The term "heterocyclic group" refers to a 5-8 membered monocyclic, 8-12 membered bicyclic or 11-14 membered tricyclic heteroaryl or heterocycloalkyl having at least one heteroatom which is selected from the group consisting of O, S and N. Specific examples of heterocyclic group include, but are not limited to, pyridyl, pyrimidinyl, furyl, thiazolyl, imidazolyl or thienyl.

When $R_1$, $R_2$ and/or $R_3$ are groups substituted with a substituent, the substituent preferably is a hydrophilic substituent. When Y is a group substituted with a substituent, the substituent preferably is a hydrophobic substituent.

Herein, specific examples of the silane or the derivatives thereof can be represented by any one the following formulas (I-1) to (I-3):

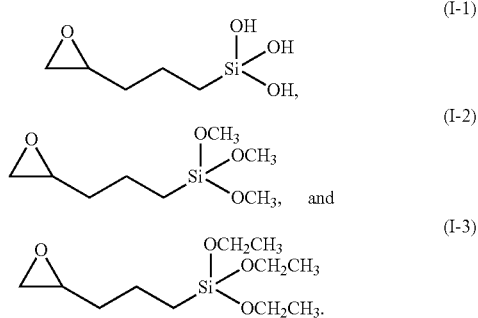

In addition, in the electronic device and the method of the present disclosure, a material of the inorganic layer is a metal oxide or a ceramic material. Preferably, the material of the inorganic layer is at least one selected from the group consisting of alumina, silicon oxide, silicon nitride, and silicon nitroxide.

In the electronic device and the method of the present disclosure, the first substrate includes a polymer substrate; wherein a material of the polymer substrate as the first substrate can be popypropylene (PP), polyethylene naphthalate (PEN), polyethylene terephthalate (PET) or polyimide (PI).

In the conventional electronic device, the inorganic layer is directly mounted on the polymer substrate. However, no covalent bond is formed between the inorganic layer and the plastic layer, and the adhering of the inorganic layer on the polymer substrate is achieved via the weak Van der waals force and anchoring force. During the follow-up manufacturing process, the inorganic layer may be separated from the polymer substrate or pinholes may be formed between the inorganic layer and the polymer substrate due to the high temperature and the generated moisture.

In the electronic device and the method of the present disclosure, an adhesion layer formed by the silane or derivatives thereof is sandwiched between the polymer substrate and the inorganic layer. Covalent bonds can be respectively formed between the adhesion layer and the polymer substrate/the inorganic layer, so the adhesion between the inorganic layer and the polymer substrate can be enhanced by the adhesion layer. Hence, the poor adhesion at the heterogeneous interface between the inorganic layer and the polymer substrate found in the conventional electronic device can be enhanced by applying the adhesion layer of the present disclosure; therefore, the performance and the yield rate of the obtained electronic device with the adhesion layer of the present disclosure can further be improved.

Other objects, advantages, and novel features of the disclosure will become more apparent from the following detailed description when taken in conjunction with the accompanying drawings.

DETAILED DESCRIPTION OF THE PREFERRED EMBODIMENT

The present disclosure has been described in an illustrative manner, and it is to be understood that the terminology used is intended to be in the nature of description rather than of limitation. Many modifications and variations of the present disclosure are possible in light of the above teachings. Therefore, it is to be understood that within the scope of the appended claims, the disclosure may be practiced otherwise than as specifically described.

Figure 1A:
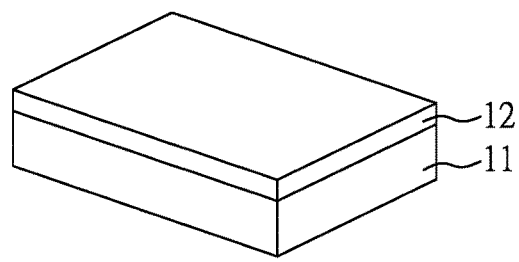
FIGS. 1A to 1D are perspective views showing a process for manufacturing an electronic device according to one preferred embodiment of the present disclosure.

FIGS. 1A to 1D are perspective views showing a process for manufacturing an electronic device according to one preferred embodiment of the present disclosure. As shown in FIG. 1A, in the manufacturing process of the electronic device of the present embodiment, a first substrate 12 is firstly provided, which is a polymer substrate. Herein, the polymer substrate suitable for the present embodiment can be a PP, PEN, PET or PI substrate. In addition, a thickness of the first substrate 12 is not particularly limited, and can be adjusted according to the device designs. For example, the thickness of the first substrate 12 can be reduced, to adjust the flexibility of the obtained flexible electronic device. In the present embodiment, the thickness of the first substrate 12 can be ranged from 10 µm to 250 µm. When the first substrate 12 is a PI substrate, the thickness thereof is preferably between 15 µm to 50 µm. When the first substrate 12 is a PET substrate, the thickness thereof is preferably about 200 µm. However, the present disclosure is not limited thereto.

In some cases, if the first substrate 12 is thin and does not have enough rigidity, the thin first substrate 12 cannot be directly applied on the machine for the rigid substrate. Hence, as shown in FIG. 1A, a carrier 11 can further be provided, and the first substrate 12 is placed on the carrier 11 to enhance the rigidity of the first substrate 12.

Next, a surface of the first substrate 12 is modified to obtain a hydrophilic surface. Herein, the surface of the first substrate 12 can be modified with UV light or plasma, and then —OH groups are exposed on the modified surface.

Figure 1B:
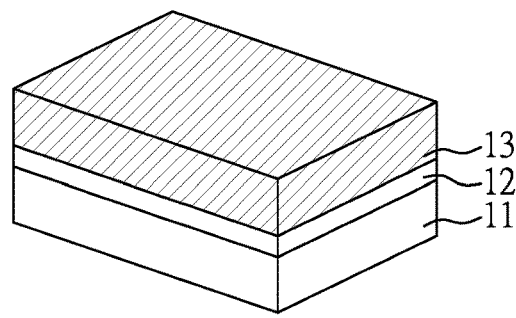

Then, as shown in FIG. 1B, the modified surface of the first substrate 12 is coated with silane or derivatives thereof to form an adhesion precursor layer 13. Herein, the adhesion precursor layer 13 can be formed by dip coating, roll coating, printing coating, spin coating, slit coating or other coating manners. The thickness of the adhesion precursor layer 13 can be ranged from 10 nm to 100 nm, and preferably ranged from 30 nm to 40 nm. Herein, the silane or derivatives thereof used for forming the adhesion precursor layer 13 can be represented by the following formula (I):

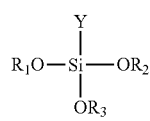
(I)

wherein each of $R_1$, $R_2$ and $R_3$ independently is H or $C_{1-6}$ alkyl; and Y is $C_{1-20}$ alkyl, $C_{2-20}$ alkenyl, $C_{1-20}$ alkyl-epoxy, epoxy, $C_{1-20}$ alkyl-acryl, or —O—$C_{1-20}$ alkyl. Herein, —$OR_1$, —$OR_2$ and —$OR_3$ are hydrophilic functional groups (hydrophilic ends), which can combine with the exposed —OH groups on the modified surface of the first substrate 12 via a condensation reaction to form covalent bonds. Y is a hydrophobic functional group (hydrophobic end). Herein, the hydrophilic ends of the adhesion precursor layer 13 face toward the first substrate 12, and hydrophobic ends are exposed on the surface of the adhesion precursor layer 13.

In the present embodiment, specific examples of the silane or derivatives thereof can be any one the following formulas (I-1) to (I-3):

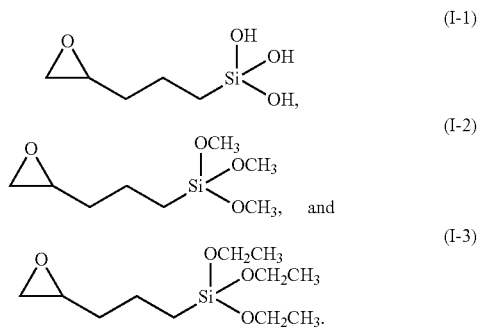

Figure 1C:
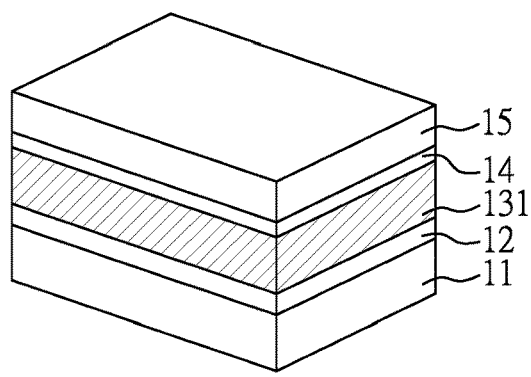

Next, as shown in FIG. 1C, a heat treatment is performed to transfer the hydrophobic ends on the surface of the adhesion precursor layer 13 into hydrophilic —OH groups, to obtain an adhesion layer 131. Herein, the temperature and the time for the heat treatment can be adjusted according to the property of the silane or derivatives thereof. Preferably, the temperature of the heat treatment can be ranged from 60° C. to 100° C.; and the time thereof can be in a range between 5 min to 20 min.

As shown in FIG. 1C, an inorganic layer 14 is formed on the adhesion layer 131, and the —OH groups on the surface of the adhesion layer 131 can react with the inorganic layer 14 to form covalent bonds. Before forming the inorganic layer 14, the obtained structure can be placed in an oven to remove water or moisture. The temperature for removing water or moisture can be ranged from 150° C. to 250° C.; and the time thereof can be in a range between 20 min to 120 min. In the present embodiment, the material for the inorganic layer 14 can be a metal oxide or a ceramic material, such as alumina, silicon oxide, silicon nitride and silicon nitroxide. The thickness of the inorganic layer 14 can be ranged from 0.2 µm to 1 µm, and preferably ranged from 0.2 µm to 0.5 µm; but the present disclosure is not limited thereto.

Figure 1D:
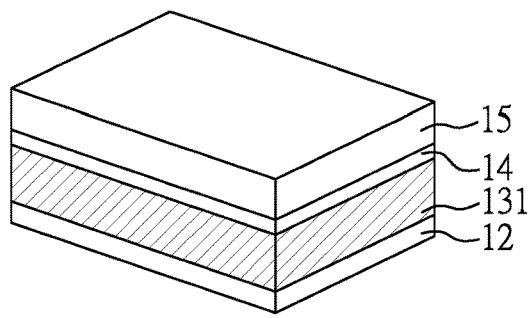

Finally, an active unit 15 is formed on the inorganic layer 14 and the inorganic layer 14 is disposed between the adhesion layer 131 and the active unit 15. After the carrier 11 under the first substrate 12 is removed, the electronic device of the present embodiment is obtained, as shown in FIG. 1D.

After the above steps, the obtained electronic device of the present embodiment comprises: a first substrate 12 including a polymer substrate; an adhesion layer 131 disposed on the first substrate 12 and comprising a condensation product of silane or derivatives thereof; an inorganic layer 14 disposed on the adhesion layer 131; and an active unit 15 disposed on the inorganic layer 14, wherein the inorganic layer 14 is disposed between the adhesion layer 131 and the active unit 15.

Hereinafter, the following Embodiment 1 is used to describe the reaction and bonding between the adhesion layer 131 and the first substrate 12 as well as between the adhesion layer 131 and the inorganic layer 14 in details.

Embodiment 1

In the present embodiment, the first substrate is a PI substrate, and the silane derivative is the compound represented by the following formula (I-1):

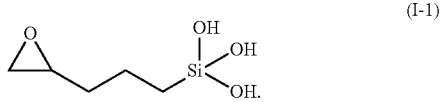
(I-1)

FIGS. 2A to 2D are perspective views showing bonds between the first substrate and the adhesion layer during the method for manufacturing the electronic device of the present embodiment.

Figure 2A:
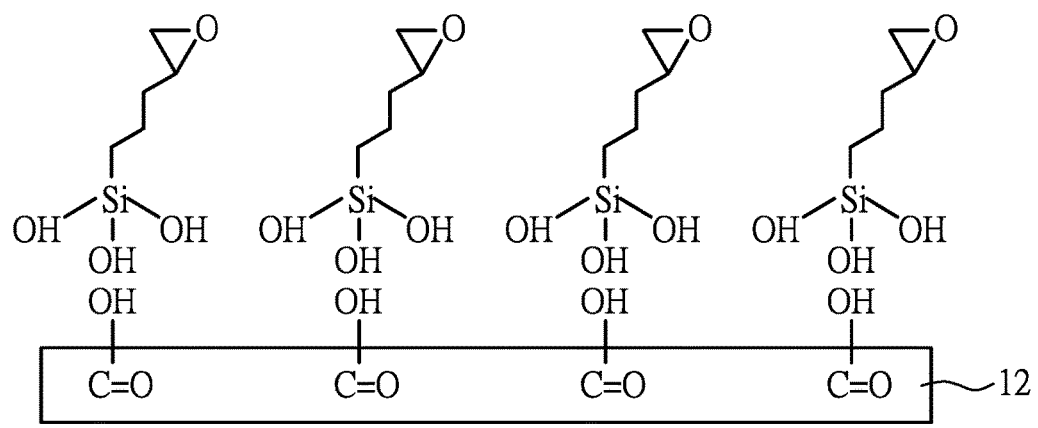
FIGS. 2A to 2D are perspective views showing bonds between the first substrate and the adhesion layer during the method for manufacturing an electronic device according to Embodiment 1 of the present disclosure.

As shown in FIG. 1A, a first substrate 12 is firstly provided, which is a PI substrate. Then, a surface of the first substrate 12 is modified, and —OH groups are exposed on the modified surface, as shown in FIG. 2A. Herein, the reaction for the modification of the PI substrate with UV light is represented by the following Scheme I.

[Scheme I]
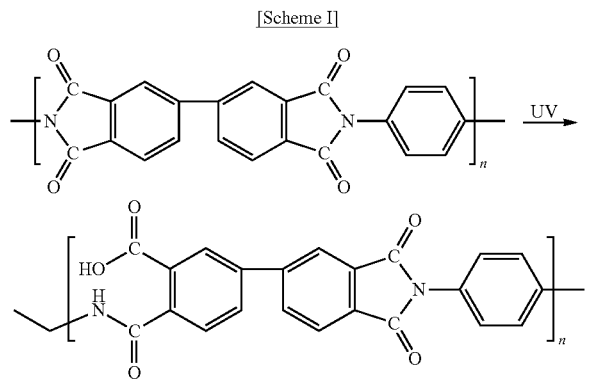

In FIG. 2A, in order to simply illustrate the bonding between the first substrate 12 and the sequential adhesion layer, only the carboxyl groups (—COOH) generated after the modification are shown on the first substrate 12.

Figure 2B:
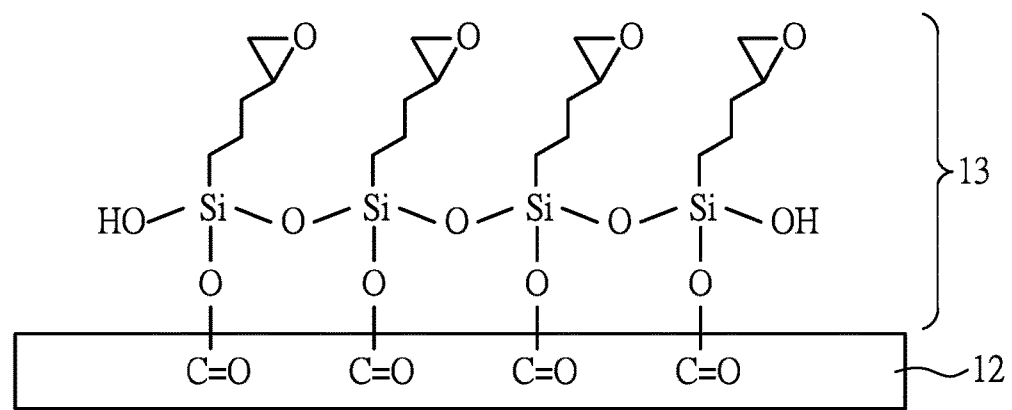

Next, as shown in FIGS. 1B, 2A and 2B, the compound of the formula (I-1) is coated on the modified surface of the first substrate 12 to form an adhesion precursor layer 13. The oxygen atoms of the hydrophilic functional groups, —Si(OH)$_3$ (hydrophilic ends) have high electron density and good reactivity. Hence, after forming the adhesion precursor layer 13, the hydrophilic ends can combine with the exposed —OH groups on the modified surface of the first substrate 12 via a condensation reaction, to form —C—O—Si— covalent bonds, as shown in FIG. 2B. The hydrophobic functional groups, epoxy (hydrophobic ends) are exposed on the surface of the adhesion precursor layer 13. Herein, only one layer of the silane derivative is shown in the figure. However, a person skilled in the art can understand that the obtained adhesion precursor layer 13 comprises multi-layers of the silane derivative.

Figure 2C:
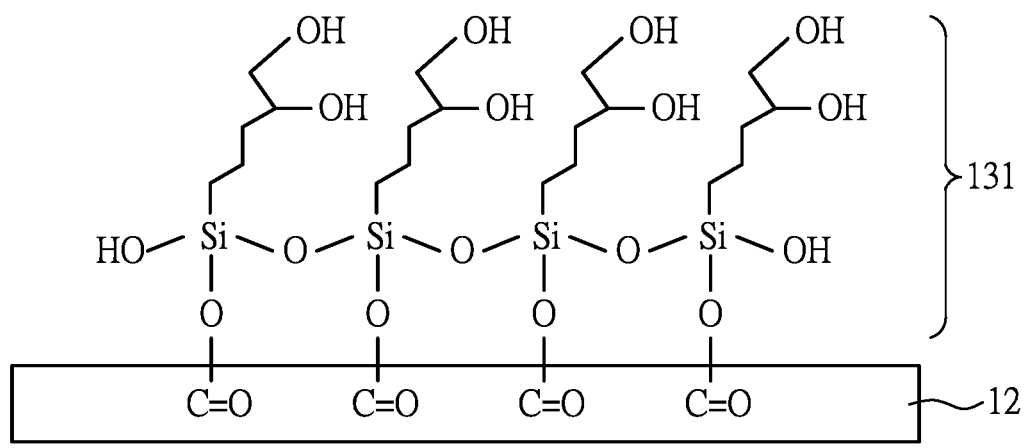

After performing the heat treatment under 70° C. for 10 min, the epoxy groups on the surface of the adhesion precursor layer 13 undergo ring opening reactions and transfer into hydrophilic —OH groups, and an adhesion layer 131 is obtained, as shown in FIGS. 1C and 2C. In the present embodiment, the adhesion layer 131 has a thickness of about 40 nm.

Figure 2D:
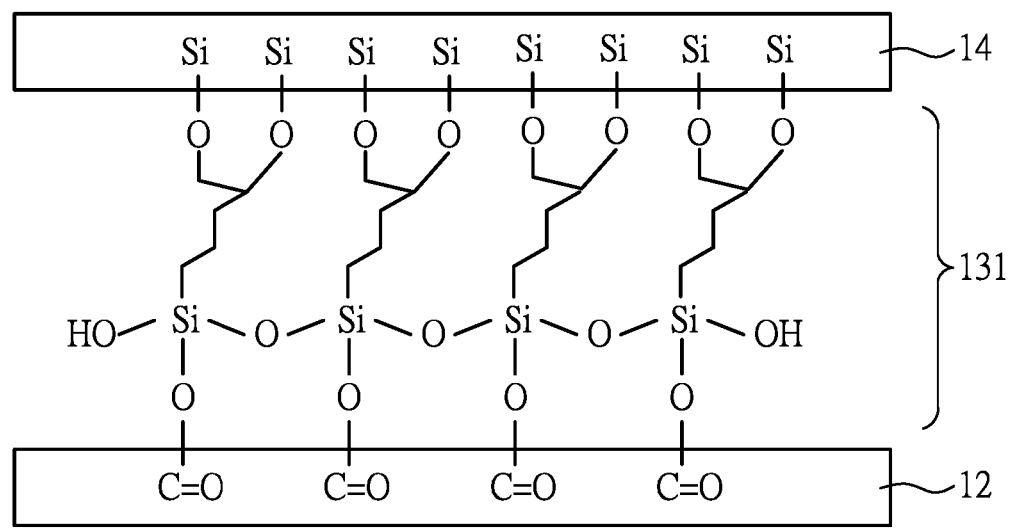

Finally, as shown in FIGS. 1C and 2D, silicon oxide is deposited on the adhesion layer 131 to form an inorganic layer 14. The —OH groups on the adhesion layer 131 can further combine with the silicon oxide via a condensation reaction, to form —C—O—Si— covalent bonds.

The silicon oxide layer as the inorganic layer 14 is exemplified in the present embodiment. However, in other embodiment of the present disclosure, the material of the inorganic layer 14 can be alumina, silicon oxide, silicon nitride or silicon nitroxide, and the generated covalent bonds between the inorganic layer 14 and the adhesion layer 131 can be -M1-M2-C-, in which M1 is Si or Al, and M2 is O or N.

As shown in FIGS. 2A to 2D, when the adhesion layer 131 of the present embodiment is formed between the first substrate 12 and the inorganic layer 14, the problem of the poor adhesion at the heterogeneous interface between the surfaces of the inorganic layer 14 and the first substrate 12 can be improved due to the formed covalent bonds between the adhesion layer 131 and the first substrate 12/the inorganic layer 14. The results of the scanning electron microscope (SEM) also confirmed that pinholes are found between the first substrate 12 and the inorganic layer 14 if the adhesion layer 131 is not disposed therebetween. When the adhesion layer 131 is disposed between the first substrate 12 and the inorganic layer 14, no pinholes are found at the interfaces and thus the peeling problem can be prevented.

In addition, the electron spectroscopy for chemical analysis (ESCA) was further performed to confirm whether the covalent bonds are respectively formed between the adhesion layer 131 and the first substrate 12/the inorganic layer 14.

Figure 3A:
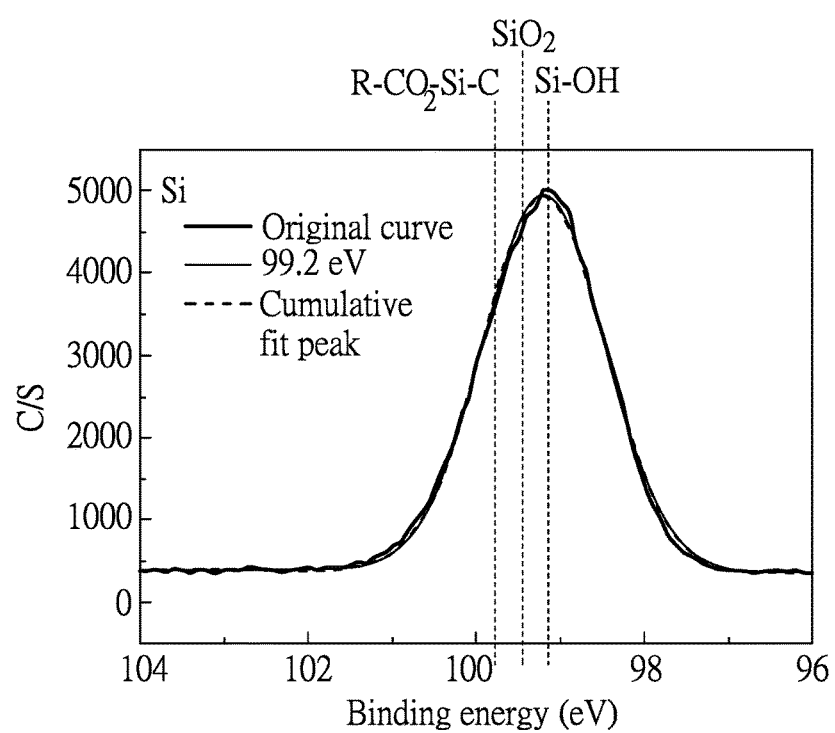
FIG. 3A is an electron spectrum for chemical analysis of silicon (Si) containing in silane used in Embodiment 1 of the present disclosure.
Figure 3B:
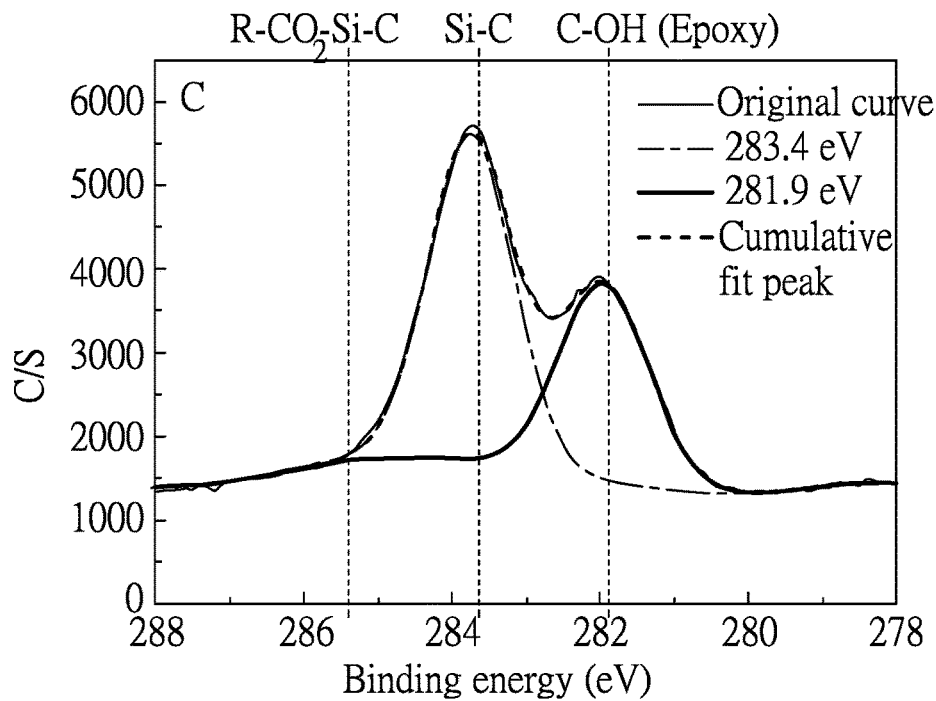
FIG. 3B is an electron spectrum for chemical analysis of carbon (C) containing in silane used in Embodiment 1 of the present disclosure.
Figure 3C:
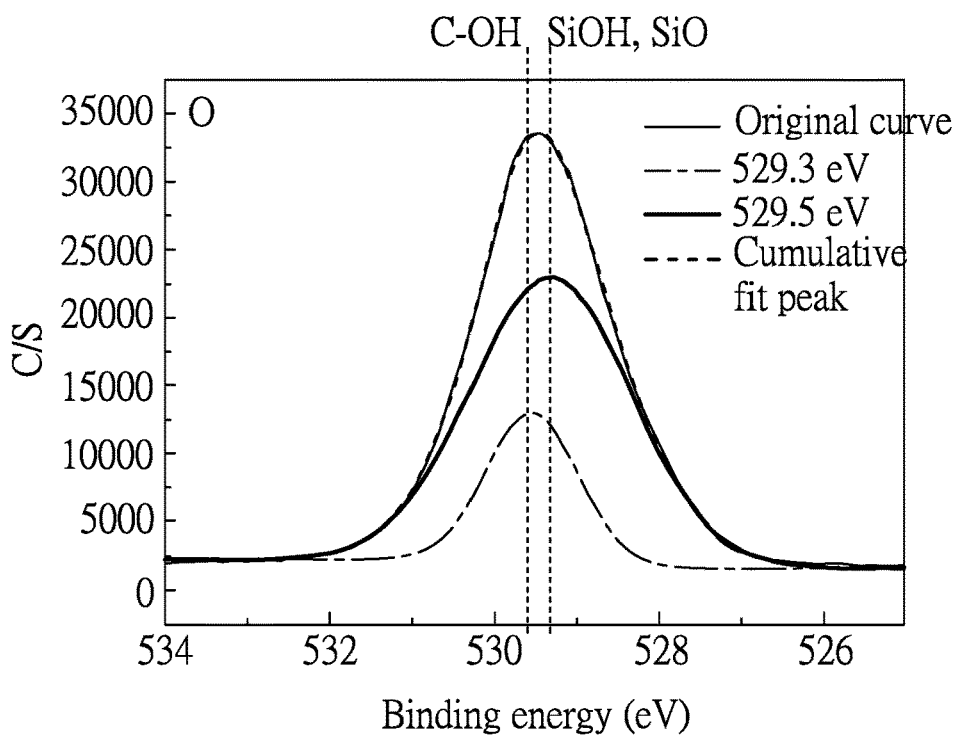
FIG. 3C is an electron spectrum for chemical analysis of oxygen (O) containing in silane used in Embodiment 1 of the present disclosure.

FIGS. 3A to 3C respectively are electron spectra for chemical analysis of silicon (Si), carbon (C) and oxygen (O) containing in silane compound of formula (I-1) used in the present embodiment before the coating process. The value from the electron spectra are respectively listed in the following Tables 1 to 3. "R" in R—CO$_2$—Si—C refers to the group of PI other than —COOH. Herein, the electron spectra were measured by applying the compound of formula (I-1) on a glass substrate.

TABLE 1

| Si spectrum | | | |
|---|---|---|---|
| Chemical state | Binding energy | Area | % |
| Si—OH | 99.2 eV | 8317.0 | 100 |

TABLE 2

| C spectrum | | | |
|---|---|---|---|
| Chemical state | Binding energy | Area | % |
| Si—C | 283.4 eV | 5611.87 | 60.7 |
| C—OH (epoxy) | 281.9 eV | 3633.27 | 39.3 |

TABLE 3

| O spectrum | | | |
|---|---|---|---|
| Chemical state | Binding energy | Area | % |
| C—OH | 529.5 eV | 15398.7 | 23.1 |
| SiOH  SiO$_2$ | 529.3 eV | 51475.9 | 76.9 |

As shown in FIG. 3A and Table 1, the peaks found in Si spectrum are symmetric and the binding energy is relative low. This result indicates that the Si end in the compound of formula (I-1) is present in a completely hydrolyzed form (—Si(OH)$_3$) and does not condense into SiO$_2$.

As shown in FIGS. 3B and 3C and Tables 2 and 3, from the areas of the fitting peaks, the carbon chain on the Si end has three carbon atoms, and the carbon chain on the epoxy has two carbon atoms. In addition, three —OH groups bind to the Si end, and one oxygen is belonged to the epoxy group. These results are consistent with the chemical formula of the compound of formula (I-1).

Figure 4A:
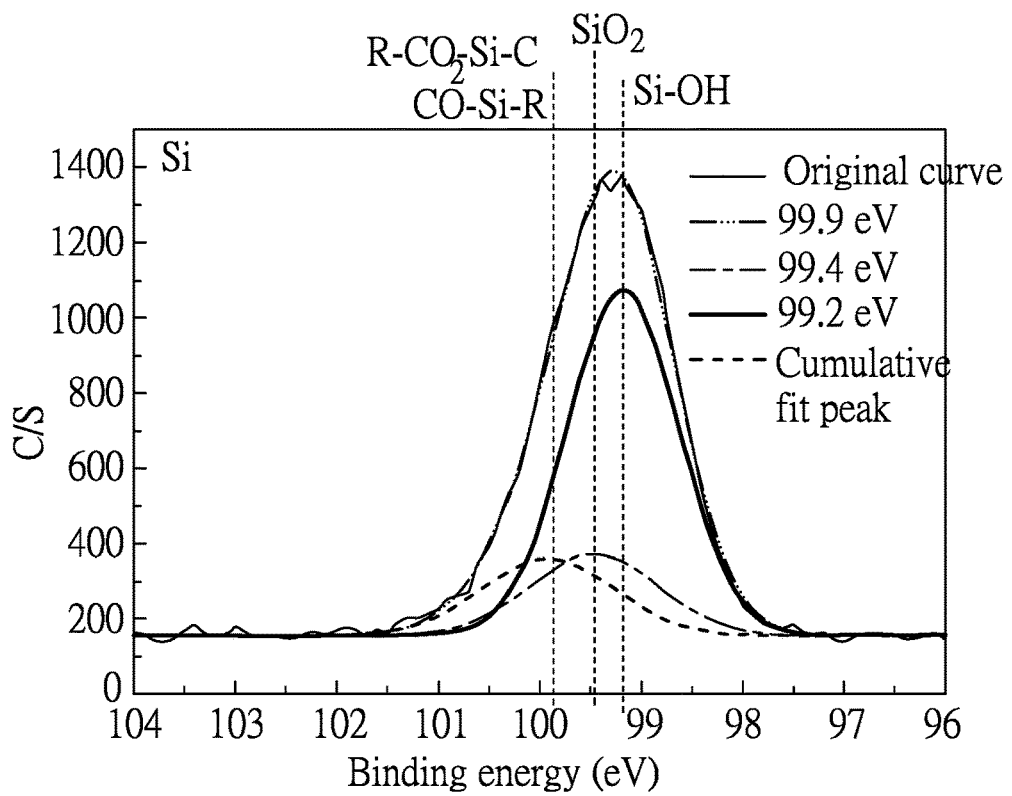
FIG. 4A is an electron spectrum for chemical analysis of Si containing in adhesion precursor layer in Embodiment 1 of the present disclosure.
Figure 4B:
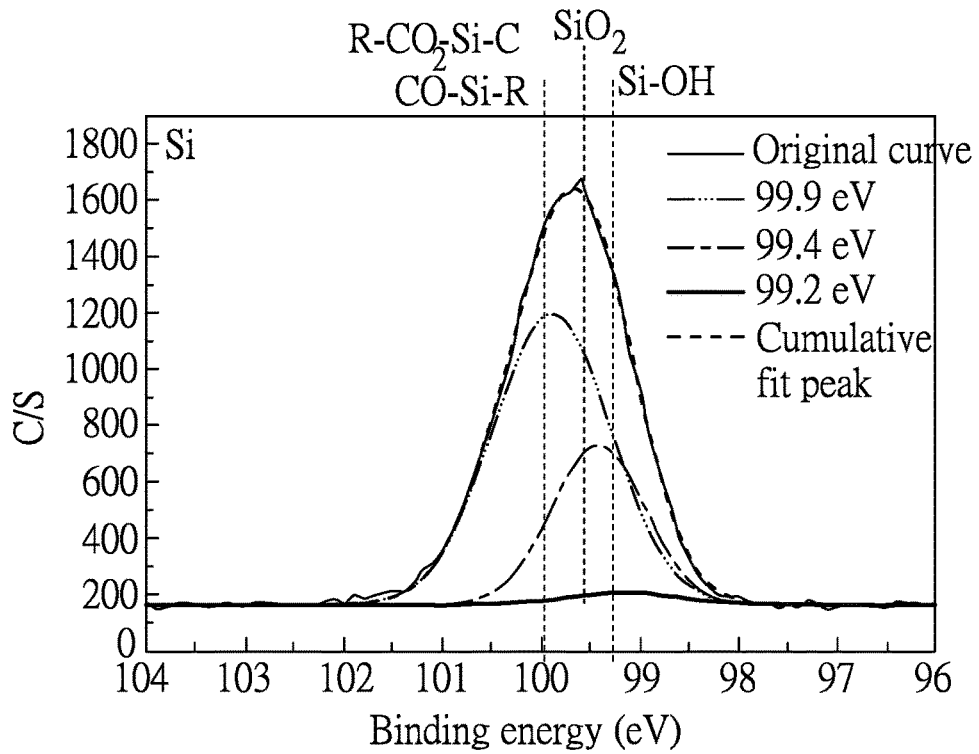
FIG. 4B is an electron spectrum for chemical analysis of Si containing in adhesion layer in Embodiment 1 of the present disclosure.

FIGS. 4A and 4B are respectively electron spectra for chemical analysis of Si containing in the adhesion precursor layer after the coating process and in the adhesion layer formed after the heat treatment process. The value from the electron spectra are respectively listed in the following Tables 4 to 5. In addition, the values from the electron spectra shown in FIGS. 3A, 4A and 4B are further summarized in the following Table 6. In FIGS. 4A and 4B, "R" in R—CO$_2$—Si—C refers to the group of PI other than —COOH. CO—Si—R refers to the group that an epoxy group (providing —C—OH) in one silane compound combines with the hydroxyl group (providing HO—Si—R) in another silane compound via a condensation reaction.

TABLE 4

Si spectrum of the adhesion precursor layer

| Chemical state | Binding energy | Area | % |
|---|---|---|---|
| R—CO$_2$—Si—C | 99.9 eV | 335.3 | 17.3 |
| SiO$_2$ | 99.4 eV | 338.4 | 17.5 |
| Si—OH | 99.2 eV | 1259.0 | 65.2 |

TABLE 5

Si spectrum of the adhesion layer

| Chemical state | Binding energy | Area | % |
|---|---|---|---|
| R—CO$_2$—Si—C | 99.9 eV | 1541.8 | 68.0 |
| SiO$_2$ | 99.4 eV | 668.7 | 29.5 |
| Si—OH | 99.2 eV | 57.7 | 2.5 |

TABLE 6

| Chemical state | Binding energy | % FIG. 3A | FIG. 4A | FIG. 4B |
|---|---|---|---|---|
| R—CO$_2$—Si—C or R—CO—Si—C | 99.9 eV | — | 17.3 | 68.0 |
| SiO$_2$ | 99.4 eV | — | 17.5 | 29.5 |
| Si—OH | 99.2 eV | 100 | 65.2 | 2.5 |

As shown in FIGS. 3A and 4A and Table 4, the signal of Si—OH found in the adhesion precursor layer after the coating process is reduced, comparing to the signal of Si—OH found in the silane compound of formula (I-1) before the coating process. This result indicates that the Si ends of the silane compound of formula (I-1) can face to the PI substrate and combine with the —OH group on the PI substrate to form a covalent bound via a condensation reaction.

As shown in FIGS. 3A, 4A and 4B and Table 6, the signals of R—CO$_2$—Si—C, CO—S—R and SiO$_2$ found in the adhesion precursor layer after the coating process and the adhesion layer after the heat treatment process are reduced, comparing to those found in the silane compound of formula (I-1) before the coating process. These results indicate that the condensation reaction of the silane compound is complete after the heat treatment process.

Figure 5A:
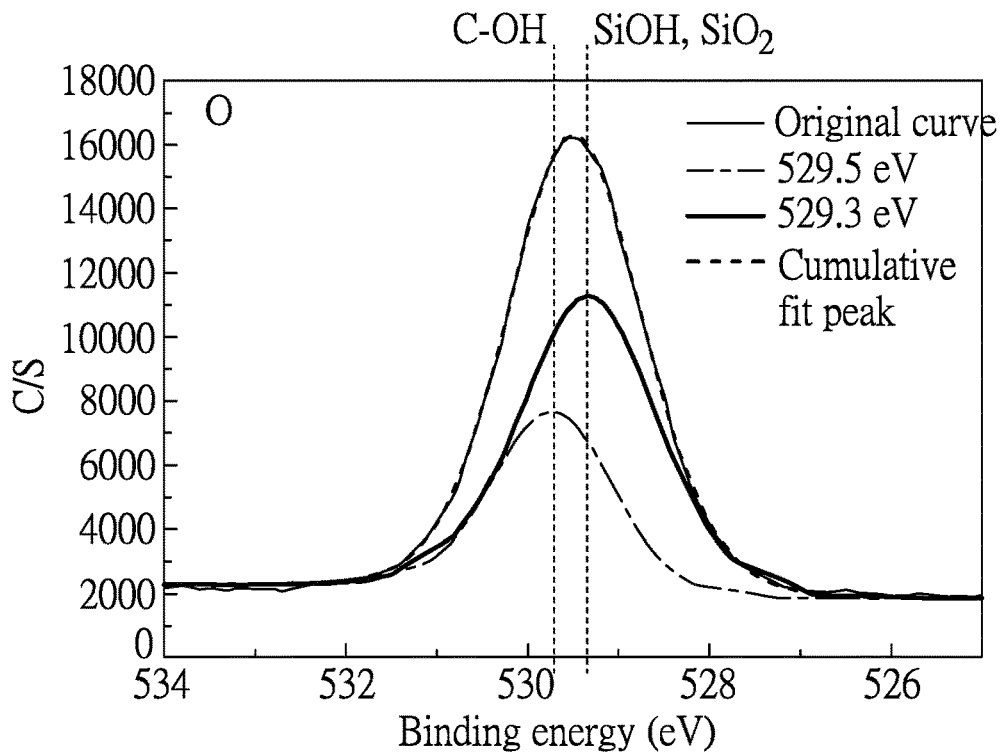
FIG. 5A is an electron spectrum for chemical analysis of O containing in adhesion precursor layer in Embodiment 1 of the present disclosure.
Figure 5B:
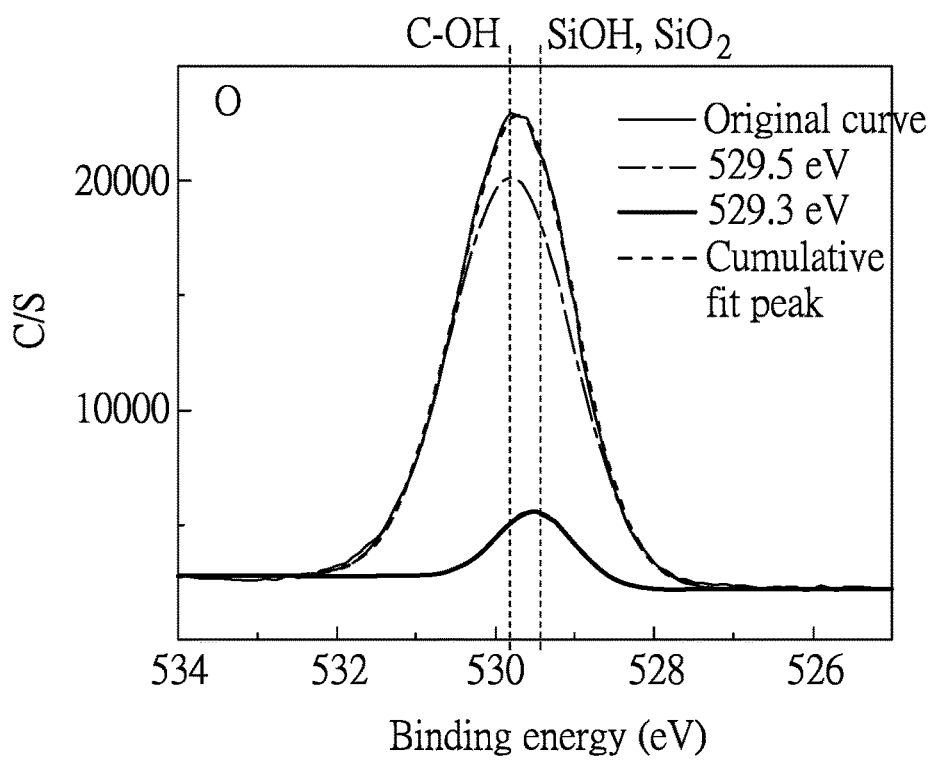
FIG. 5B is an electron spectrum for chemical analysis of O containing in adhesion layer in Embodiment 1 of the present disclosure.

FIGS. 5A and 5B are respectively electron spectra for chemical analysis of O containing in the adhesion precursor layer after the coating process and in the adhesion layer formed after the heat treatment process. The value from the electron spectra are respectively listed in the following Tables 7 to 8. In addition, the values from the electron spectra shown in FIGS. 3C, 5A and 5B are further summarized in the following Table 9.

TABLE 7

O spectrum of the adhesion precursor layer

| Chemical state | Binding energy | Area | % |
|---|---|---|---|
| C—OH | 529.5 eV | 5539.8 | 37.5 |
| SiOH, SiO$_2$ | 529.3 eV | 9236.7 | 62.5 |

TABLE 8

O spectrum of the adhesion layer

| Chemical state | Binding energy | Area | % |
|---|---|---|---|
| C—OH | 529.5 eV | 33831.5 | 89.6 |
| SiOH, SiO$_2$ | 529.3 eV | 3924.7 | 10.4 |

TABLE 9

| Chemical state | Binding energy | % FIG. 3C | FIG. 5A | FIG. 5B |
|---|---|---|---|---|
| C—OH | 529.5 eV | 23.1 | 37.5 | 89.6 |
| SiOH, SiO$_2$ | 529.3 eV | 76.9 | 62.5 | 10.4 |

As shown in FIGS. 3C, 5A and 5B and Table 9, the O signal represented by the peak of SiOH, SiO$_2$ is left-shifted, and the ratio of the peak of C—OH is increased. This result indicates that the epoxy group in the silane compound undergoes a ring opening reaction.

Figure 6A:
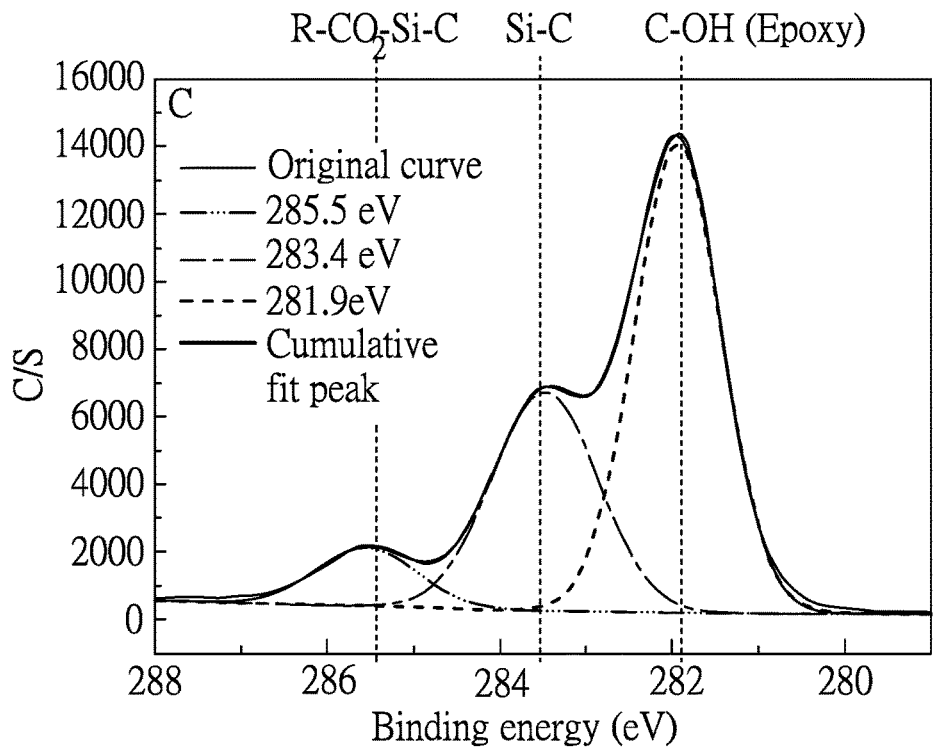
FIG. 6A is an electron spectrum for chemical analysis of C containing in adhesion precursor layer in Embodiment 1 of the present disclosure.
Figure 6B:
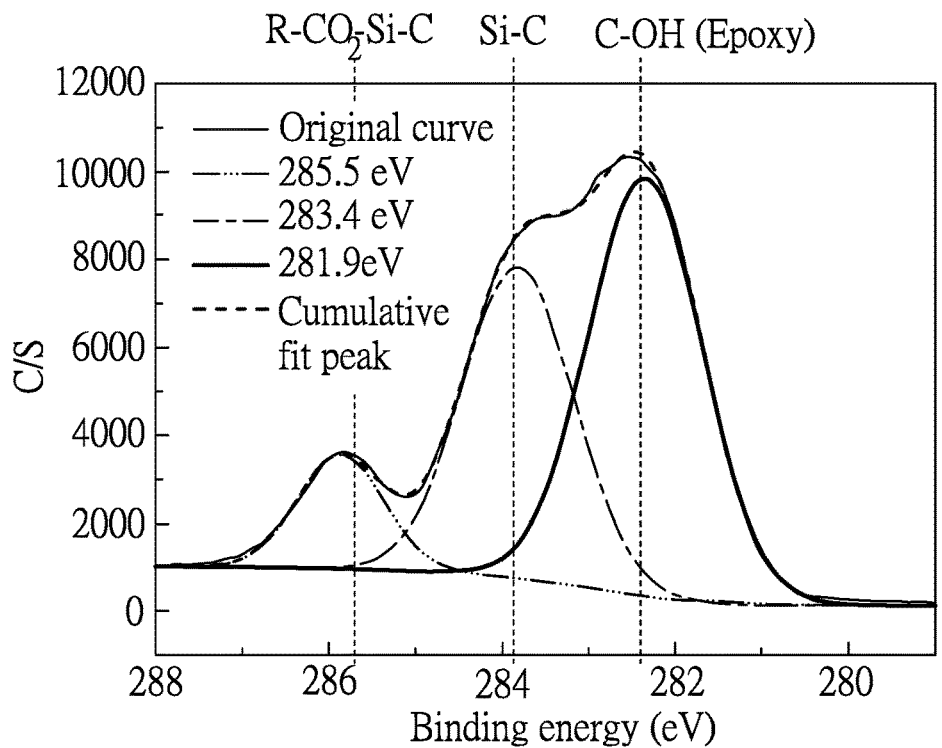
FIG. 6B is an electron spectrum for chemical analysis of C containing in adhesion layer in Embodiment 1 of the present disclosure.

FIGS. 6A and 6B are respectively electron spectra for chemical analysis of C containing in the adhesion precursor layer after the coating process and in the adhesion layer formed after the heat treatment process. The value from the electron spectra are respectively listed in the following Tables 10 to 11. In addition, the values from the electron spectra shown in FIGS. 3B, 6A and 6B are further summarized in the following Table 12.

TABLE 10

C spectrum of the adhesion precursor layer

| Chemical state | Binding energy | Area | % |
|---|---|---|---|
| R—CO$_2$—Si—C | 285.5 eV | 2493.2 | 8.3 |
| Si—C | 283.4 eV | 9922.8 | 32.9 |
| C—OH (Epoxy) | 281.9 eV | 17730.6 | 58.8 |

TABLE 11

| C spectrum of the adhesion layer | | | |
|---|---|---|---|
| Chemical state | Binding energy | Area | % |
| R—CO$_2$—Si—C | 285.5 eV | 3231.1 | 10.7 |
| Si—C | 283.4 eV | 11302.9 | 37.3 |
| C—OH (Epoxy) | 281.9 eV | 15781.4 | 52.0 |

TABLE 12

| Chemical state | Binding energy | % | | |
|---|---|---|---|---|
| | | FIG. 3B | FIG. 6A | FIG. 6B |
| R—CO$_2$—Si—C | 285.5 eV | — | 8.3 | 10.7 |
| Si—C | 283.4 eV | 60.7 | 32.9 | 37.3 |
| C—OH (Epoxy) | 281.9 eV | 39.3 | 58.8 | 52.0 |

As shown in FIGS. 3B, 6A and 6B and Table 12, the ratio of the peak of R—CO$_2$—Si—C is increased after the heat treatment process. This result indicates that the heat can facilitate the condensation reaction more complete.

The aforementioned results confirm that the adhesion layer used in the present disclosure can simultaneously form covalent bonds with the polymer substrate and the inorganic substrate. Therefore, the poor adhesion at the heterogeneous interfaces between the polymer substrate and the inorganic layer can be enhanced; therefore, the performance and the yield rate of the electronic devices can be improved.

Figure 7A:
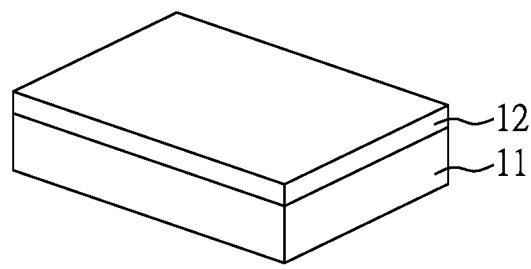
FIGS. 7A to 7E are perspective views showing a process for manufacturing an electronic device according to another preferred embodiment of the present disclosure.
Figure 7B:
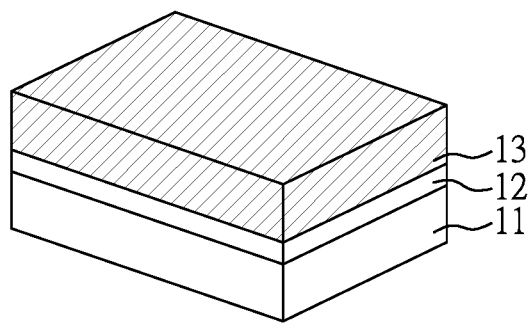
Figure 7C:
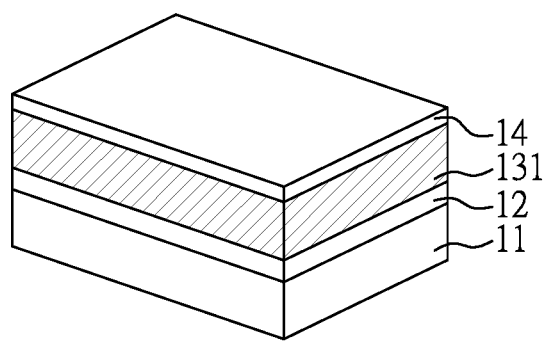
Figure 7D:
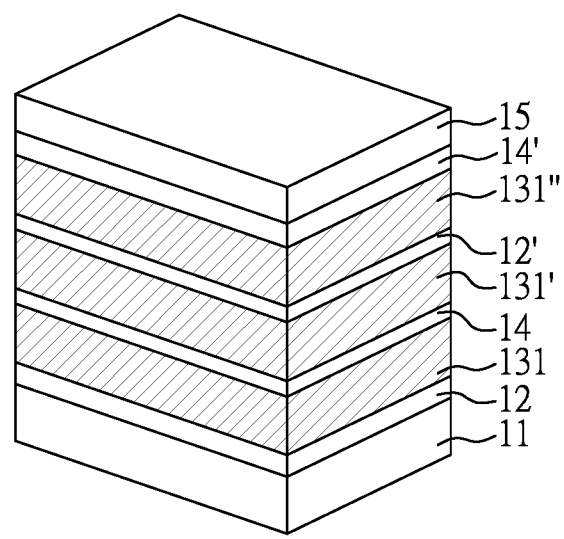

FIGS. 7A to 7E are perspective views showing a process for manufacturing an electronic device according to another preferred embodiment of the present disclosure. The process for manufacturing the electronic device of the present embodiment is similar to that shown in FIGS. 1A to 1D. The steps shown in FIGS. 7A to 7C are similar to the steps shown in FIGS. 1A to 1C, except that the active unit is not directly formed on the inorganic layer 14 in the present embodiment. After forming the inorganic layer 14 in the present embodiment, another adhesion layer 131' is formed on the inorganic layer 14. Next, anther polymer substrate 12' is formed on the adhesion layer 131'. Then, further another adhesion layer 131" and another inorganic layer 14' are sequentially formed on the adhesion layer 131'. The processes for forming the adhesion layers 131', 131" and the inorganic layer 14' are similar to those illustrated before, and are not repeated again.

Figure 7E:
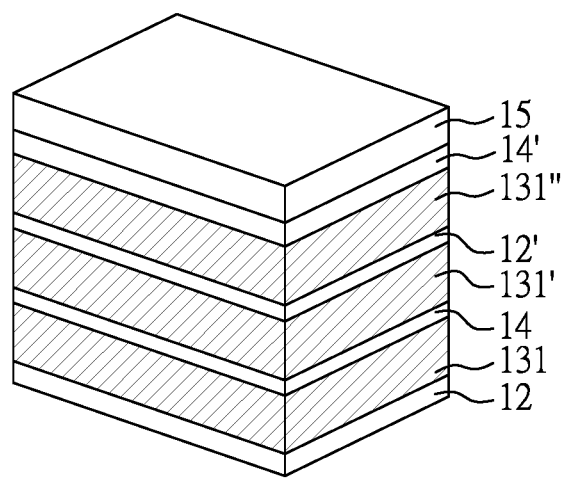

Finally, an active unit 15 is formed on the inorganic layer 14'; and the carrier 11 under the first substrate 12 is removed to obtain the electronic device of the present embodiment, as shown in FIG. 7E.

Compared to the electronic device shown in FIG. 1D, the electronic device shown in FIG. 7E has a multi-layer structure with plural first substrates 12, 12'. Hence, the rigidity of the device shown in FIG. 7E can further be improved, and the problem that the device may be cured after removing the carrier 11 can be solved.

The electronic device and the method for manufacturing the same of the present disclosure can be applied to any electronic device equipped with a polymer substrate, such as flexible display devices, flexible touch devices, solar cells, lightings, flexible printing circuit boards, electronic papers and radio frequency identification systems.

In addition, when the electronic device provided by the present disclosures is a flexible display device, it can combine with a flexible touch panel to form a touch display device. Furthermore, the display devices or the touch display devices provided by the aforementioned embodiments can be applied to any electronic device for displaying images and touch sensing, for example, monitors, mobile phones, notebooks, cameras, video cameras, music players, navigation systems, and televisions.

Although the present disclosure has been explained in relation to its preferred embodiment, it is to be understood that many other possible modifications and variations can be made without departing from the spirit and scope of the disclosure as hereinafter claimed.

What is claimed is:

1. An electronic device, comprising:
   a first substrate;
   an adhesion layer disposed on the first substrate and comprising a condensation product of silane or derivatives thereof;
   an inorganic layer disposed on the adhesion layer; and
   an active unit disposed on the inorganic layer;
   wherein the silane or the derivatives thereof is represented by the following formula (I):

wherein each of R$_1$, R$_2$ and R$_3$ is H.

2. The electronic device of claim 1, wherein a covalent bond is formed between the adhesion layer and the first substrate.

3. The electronic device of claim 2, wherein the covalent bond is —C—O—Si.

4. The electronic device of claim 1, wherein a covalent bond is formed between the adhesion layer and the inorganic layer.

5. The electronic device of claim 4, wherein the covalent bond is -M1-M2-C—, in which M1 is Si or Al, and M2 is O or N.

6. The electronic device of claim 1, wherein the adhesion layer has a thickness ranging from 10 nm to 100 nm.

7. The electronic device of claim 1,
   wherein Y is C$_{1-20}$ alkyl, C$_{2-20}$ alkenyl, C$_{1-20}$ alkyl-epoxy, epoxy, C$_{1-20}$ alkyl-acryl, or —O—C$_{1-20}$ alkyl.

8. The electronic device of claim 7, wherein Y is C$_{1-20}$ alkyl-epoxy or epoxy.

9. The electronic device of claim 8, wherein Y is epoxy.

10. The electronic device of claim 7, wherein the silane or the derivatives thereof is represented by any one the following formula:

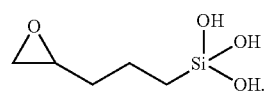

11. The electronic device of claim 1, wherein a material of the inorganic layer is a metal oxide or a ceramic material.

12. The electronic device of claim 11, wherein the material of the inorganic layer is at least one selected from the group consisting of alumina, silicon oxide, silicon nitride, and silicon nitroxide.

13. The electronic device of claim 1, wherein the first substrate includes a polymer substrate, and a material of the polymer substrate is popypropylene, polyethylene naphthalate, polyethylene terephthalate or polyimide.

* * * * *